United States Patent
Ji

(10) Patent No.: US 7,027,795 B2
(45) Date of Patent: *Apr. 11, 2006

(54) LOW TEMPERATURE CO-FIRED CERAMIC DOUBLE BALANCED MIXER

(75) Inventor: Daxiong Ji, Brooklyn, NY (US)

(73) Assignee: Scientific Components Corporation, Brooklyn, NY (US)

( * ) Notice: Subject to any disclaimer, the term of this patent is extended or adjusted under 35 U.S.C. 154(b) by 450 days.

This patent is subject to a terminal disclaimer.

(21) Appl. No.: 10/390,391

(22) Filed: Mar. 18, 2003

(65) Prior Publication Data

US 2004/0185816 A1 Sep. 23, 2004

(51) Int. Cl.
*H04B 1/28* (2006.01)
*H04B 1/26* (2006.01)

(52) U.S. Cl. .................. 455/333; 455/326; 327/208
(58) Field of Classification Search ............. 455/130, 455/280, 293, 313, 323, 324, 325, 326, 333, 455/334, 338; 327/206, 207, 208, 210, 220, 327/272, 329, 355, 359

See application file for complete search history.

(56) References Cited

U.S. PATENT DOCUMENTS 6,348,830 B1 * 2/2002 Rebeiz et al. .............. 327/355
6,427,069 B1 * 7/2002 Galin ........................ 455/326

* cited by examiner

*Primary Examiner*—Quochien B. Vuong
(74) *Attorney, Agent, or Firm*—Kevin Redmond

(57) ABSTRACT

A double balanced mixer with improved isolation between the LO and RF frequency signals. The mixer has a local oscillator balun, an intermediate frequency balun and an RF balun. The baluns are located on inner layers of a substrate comprised of low temperature co-fired ceramic. The baluns are formed from spiral lines that form windings. The windings are coupled between adjacent layers. The local oscillator balun is connected to the intermediate frequency balun. A diode ring is connected between the RF balun and the intermediate frequency balun. The diode ring is mounted to a top layer. Several vias extend through the substrate. The vias provide an electrical connection between the baluns and the diode ring.

44 Claims, 11 Drawing Sheets

| MIXER | Freq.(MHz) | | C.Loss(dB) | | | L-R Isolator(dB) | | L-I Isolation (dB) | |
|---|---|---|---|---|---|---|---|---|---|
| | LO/RF | IF | Avg. | Sigma | Max. | Typ. | Min. | Typ. | Min. |
| 1 | 300-2400 | DC-700 | 6.1 | 0.1 | 8.9 | 40 | 25 | 25 | 15 |
| 2 | 1000-4200 | DC-700 | 6.1 | 0.1 | 8.9 | 35 | 23 | 20 | 12 |

Fig. 11

LOW TEMPERATURE CO-FIRED CERAMIC DOUBLE BALANCED MIXER

CROSS REFERENCE TO RELATED AND CO-PENDING APPLICATIONS

This application is related to U.S. patent application Ser. No. 60/326,819 and U.S. patent application Ser. No. 60/356,345 both of which are herein incorporated by reference.

BACKGROUND

1. Field of the Invention

This invention relates to mixers in general and more particularly to a LTCC double balanced transistor mixer that provides wide bandwidth in a small package size with good isolation.

2. Description of Related Art

A mixer circuit converts a radio frequency (RF) signal to an intermediate frequency (IF) signal which is the difference of the RF and a local oscillator (LO) signal. The IF frequency is obtained by multiplying the RF signal with the local oscillator (LO) signal. The difference or IF frequency is a result of the non-linearity of the mixer.

Below 5 GHz, such mixers are produced using ferrite balun transformers. Unfortunately, the ferrite balun transformer is difficult to repeatedly produce. Variations in tightness of the windings, magnet wire twist rate and permeability/permissivity of the ferrite material cause a lowering of the performance. The ferrite transformers are large and require excessive circuit board space. In addition the ferrite transformers are difficult to assemble to a circuit board requiring a lengthy manual assembly process by a skilled operator. This adds undesirable cost to the product and is difficult for large scale manufacturing. The cost of a unit requiring lengthy manual assembly is dependent upon the country of manufacture.

Balun transformers can also be implemented by transmission lines such as microstrip or stripline on a printed circuit board. Transmission line balun transformers have the disadvantage of requiring large amounts of space for the transmission lines to be run along the printed circuit board. More circuit board space is required for transmission line baluns operating at lower frequencies.

Previous attempts at thick film printable mixers starting from the 800 MHz range are shown in U.S. Pat. Nos. 5,534,830, 5,640,132 and 5,640,699. The mixers shown in these patents are difficult to manufacture because the thickness of the dielectric is hard to maintain at a uniform value. This results in large variations in the electrical parameters of the prior art mixers.

While various mixers have been used, they have suffered from not being able to handle wide bandwidths with high isolation, not having uniform electrical parameters, being difficult to assemble, expensive to produce and requiring excessive circuit board space.

A current unmet need exists for a mixer that is compact, has uniform and consistent electrical parameters that can be assembled at low cost and that can handle wide frequency bandwidths with high isolation.

SUMMARY

It is a feature of the invention to provide a double balanced mixer for mixing an RF input signal with a local oscillator signal to provide at an output an intermediate frequency signal with a small package size that is easily assembled at low cost.

Another feature of the invention to provide a double balanced mixer that has improved isolation between the LO and RF.

Another feature of the invention is to provide a double balanced mixer that includes a local oscillator balun. The local oscillator balun has a local oscillator terminal for receiving a local oscillator signal. An intermediate frequency balun has an intermediate frequency terminal for providing an intermediate frequency signal. The intermediate frequency balun is connected to the local oscillator balun. An RF balun has an RF terminal for receiving an RF signal. A diode ring is connected between the RF balun and the intermediate frequency balun. The diodes mix the local oscillator signal with the RF signal to provide the intermediate frequency signal. A substrate has several layers. The substrate has a top layer, a bottom layer and inner layers. The baluns are mounted to the inner layers. The diode ring is mounted to the top layer. Several vias extend through the substrate. The vias provide an electrical connection between the baluns and the diode ring.

BRIEF DESCRIPTION OF THE DRAWINGS

FIG. 11 is a table of measured electrical parameters for two mixers built in accordance with the present invention.

It is noted that the drawings of the invention are not to scale. In the drawings, like numbering represents like elements between the drawings.

DETAILED DESCRIPTION

Figure 1:
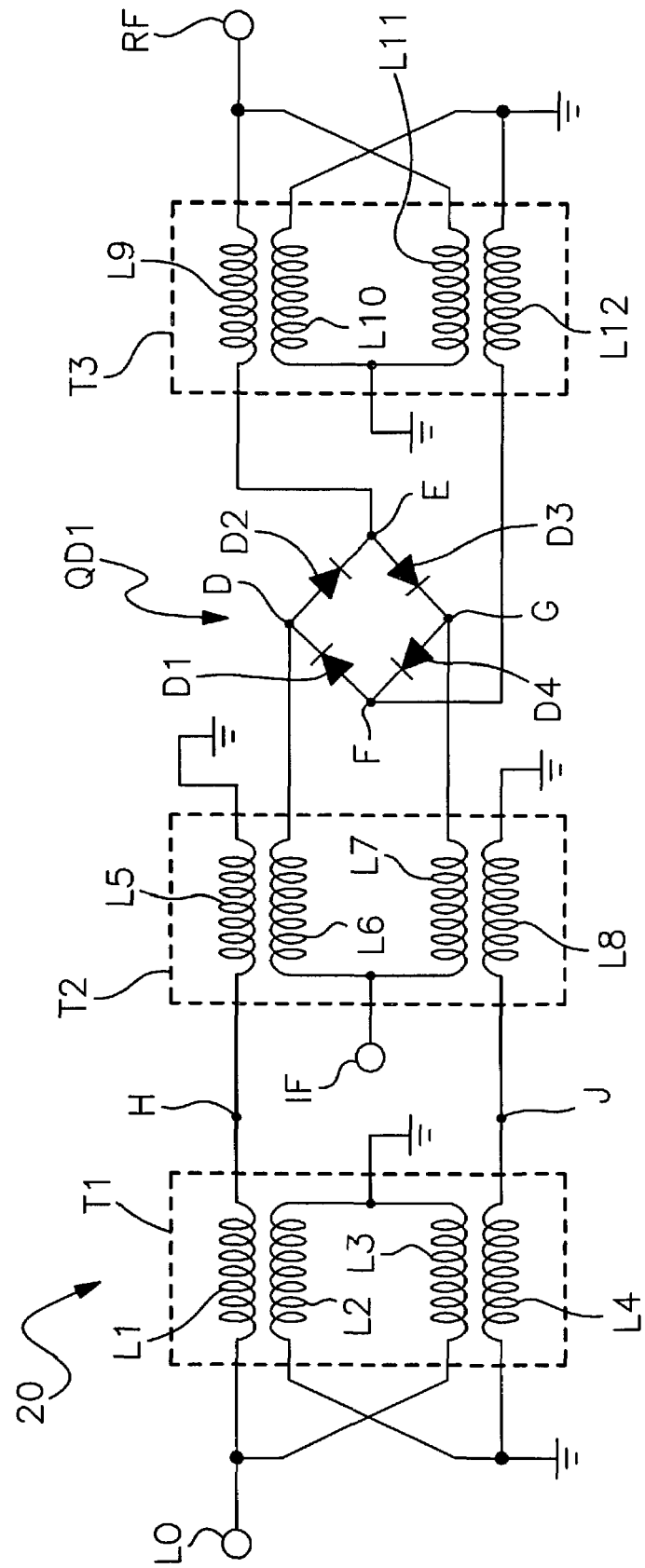
FIG. 1 is a schematic drawing of a double balanced mixer.

FIG. 1 shows a schematic diagram of a wide bandwidth double balance mixer 20. Mixer 20 has an intermediate frequency response that goes to DC. Mixer 20 has a local oscillator input terminal LO for receiving a local oscillator signal, an RF input terminal RF for receiving an RF signal and an intermediate frequency output terminal IF for providing an intermediate frequency output signal.

Local oscillator terminal LO is connected to local oscillator balun transformer T1. Transformer T1 has windings L1, L2, L3 and L4. Windings L1 and L2 are electromagnetically coupled as are windings L3 and L4. Winding L1 has one end connected to node H and the other end connected to terminal LO. Winding L2 has both ends connected to ground. Winding L3 has one end connected to terminal LO and the other end connected to ground. Winding L4 has one end connected to node J and the other end connected to ground.

Intermediate frequency output terminal IF is connected to intermediate frequency balun transformer T2. Balun T2 has windings L5, L6, L7 and L8. Windings L5 and L6 are electro-magnetically coupled. Windings L7 and L8 are electro-magnetically coupled. Winding L5 has one end connected to node H and the other end connected to ground. Winding L6 has one end connected to terminal IF and another end connected to node D of diode ring QD1. Winding L7 has one end connected to terminal IF and the other end connected to node G. Winding L8 has one end connected to node J and the other end connected to ground. The intermediate frequency signal IF is connected to terminal IF through balun T2.

Diode ring QD1 has four diodes D1, D2, D3 and D4. The diodes have their cathodes connected to the anodes of the adjoining diodes. Diode QD1 has nodes D, E, F and G.

RF input terminal RF is connected to RF balun transformer T3. Balun T3 has windings L9, L10, L11 and L12. Windings L9 and L10 are electro-magnetically coupled as are windings L11 and L12. Winding L9 has one end connected to terminal RF and the other end connected to node E. Winding L10 has both ends connected to ground. Winding L11 has one end connected terminal RF and the other end connected to ground. Winding L12 has one end connected to node F and the other end connected to ground. Thus, the RF signal is connected to mixer 20 through balun transformer T3.

Figure 2:
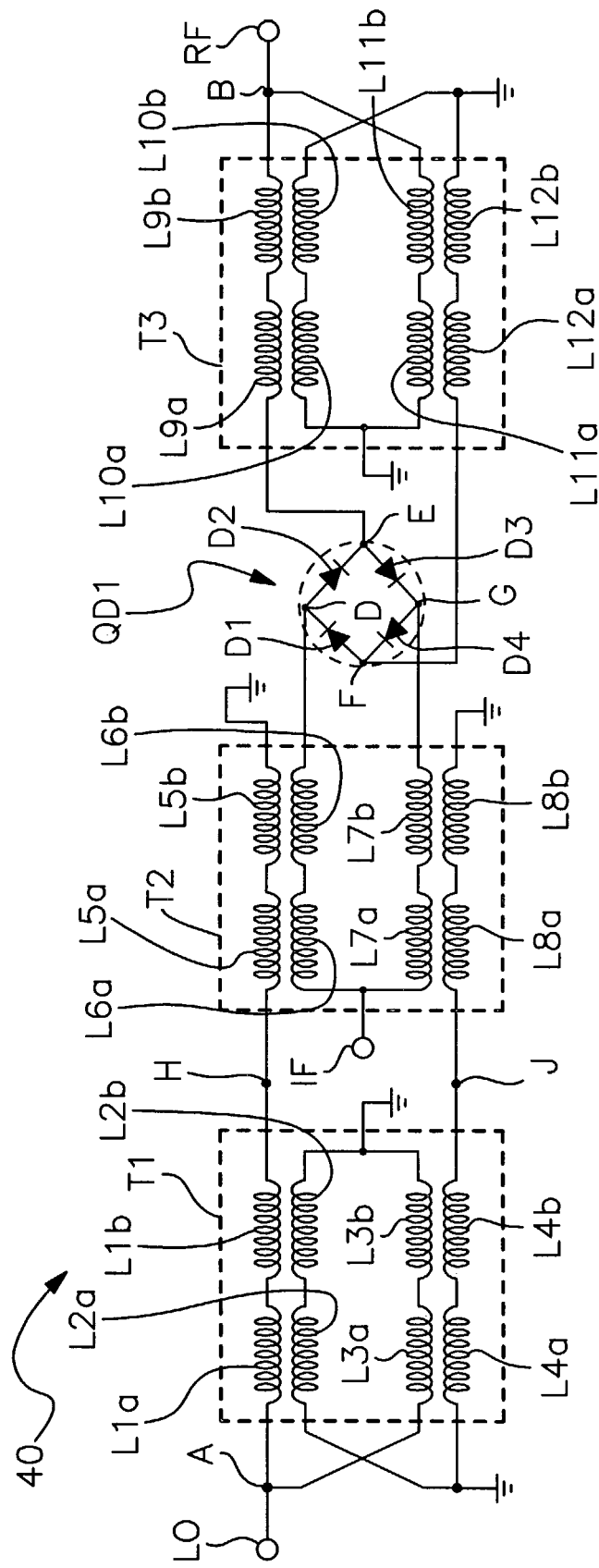
FIG. 2 is a schematic drawing of a double balanced mixer in accordance with the present invention.
Figure 3:
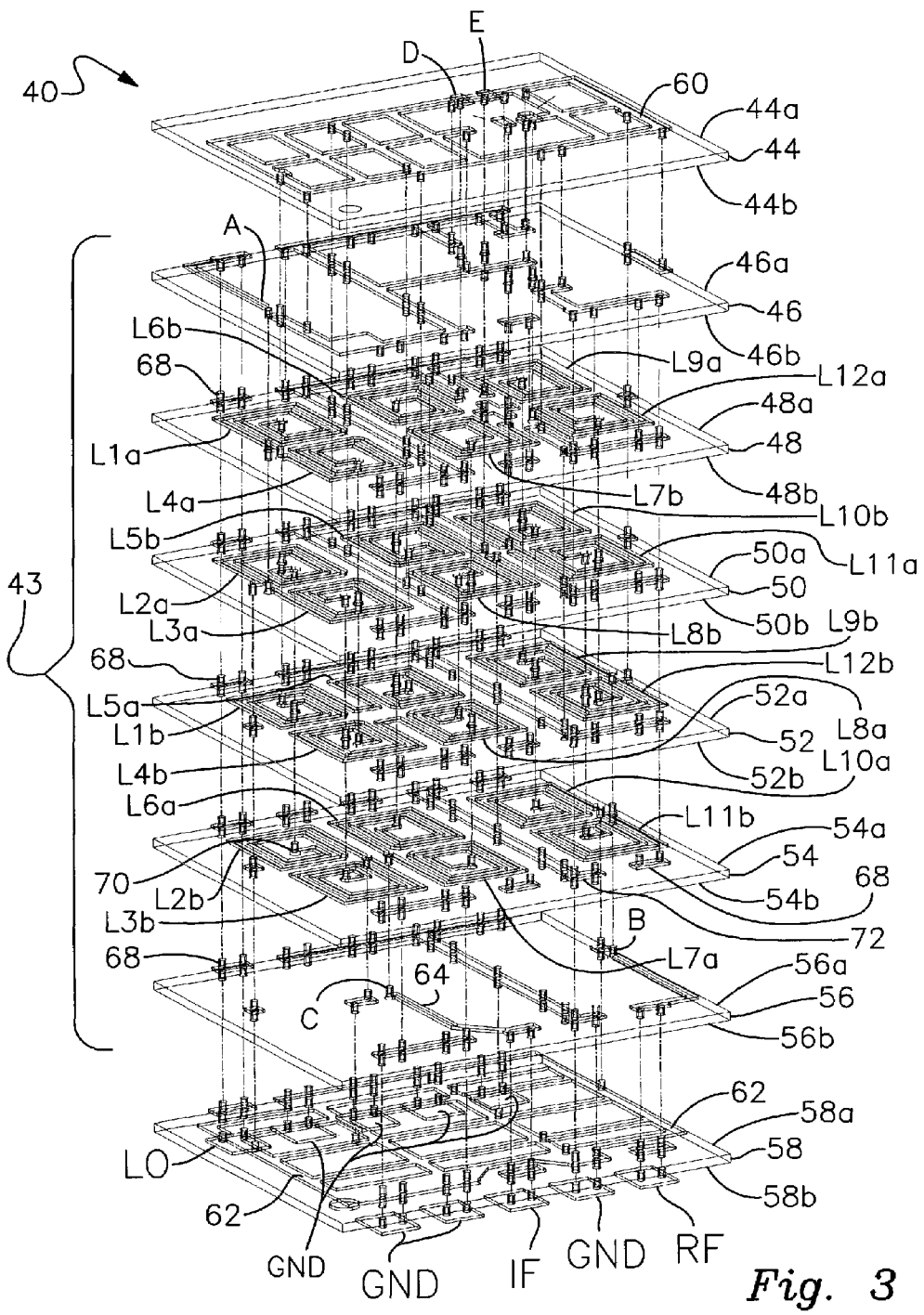
FIG. 3 is an exploded perspective view of the physical layout of the mixer of FIG. 2.
Figure 4:
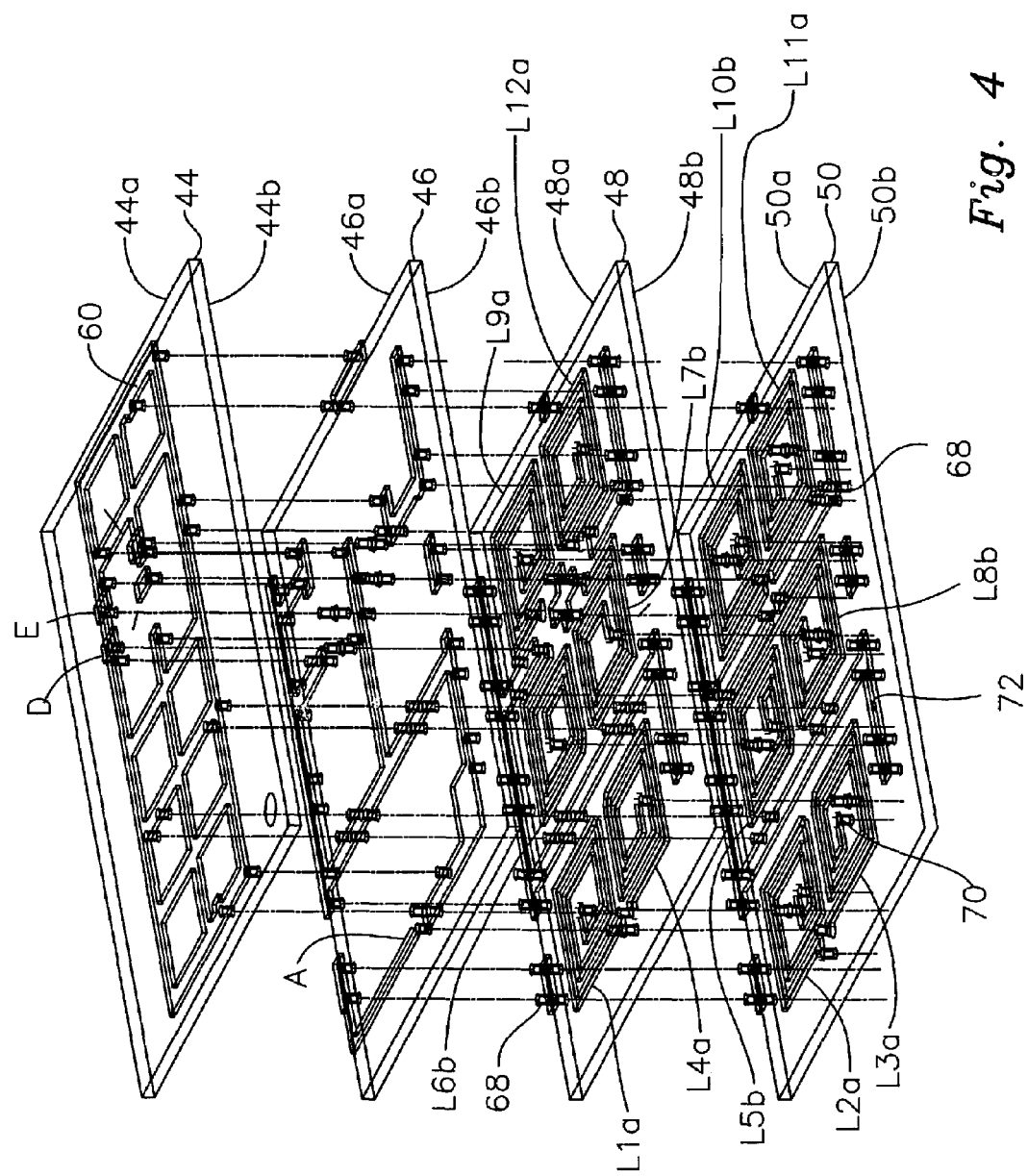
FIG. 4 is an enlarged view of the upper layers of FIG. 3.
Figure 5:
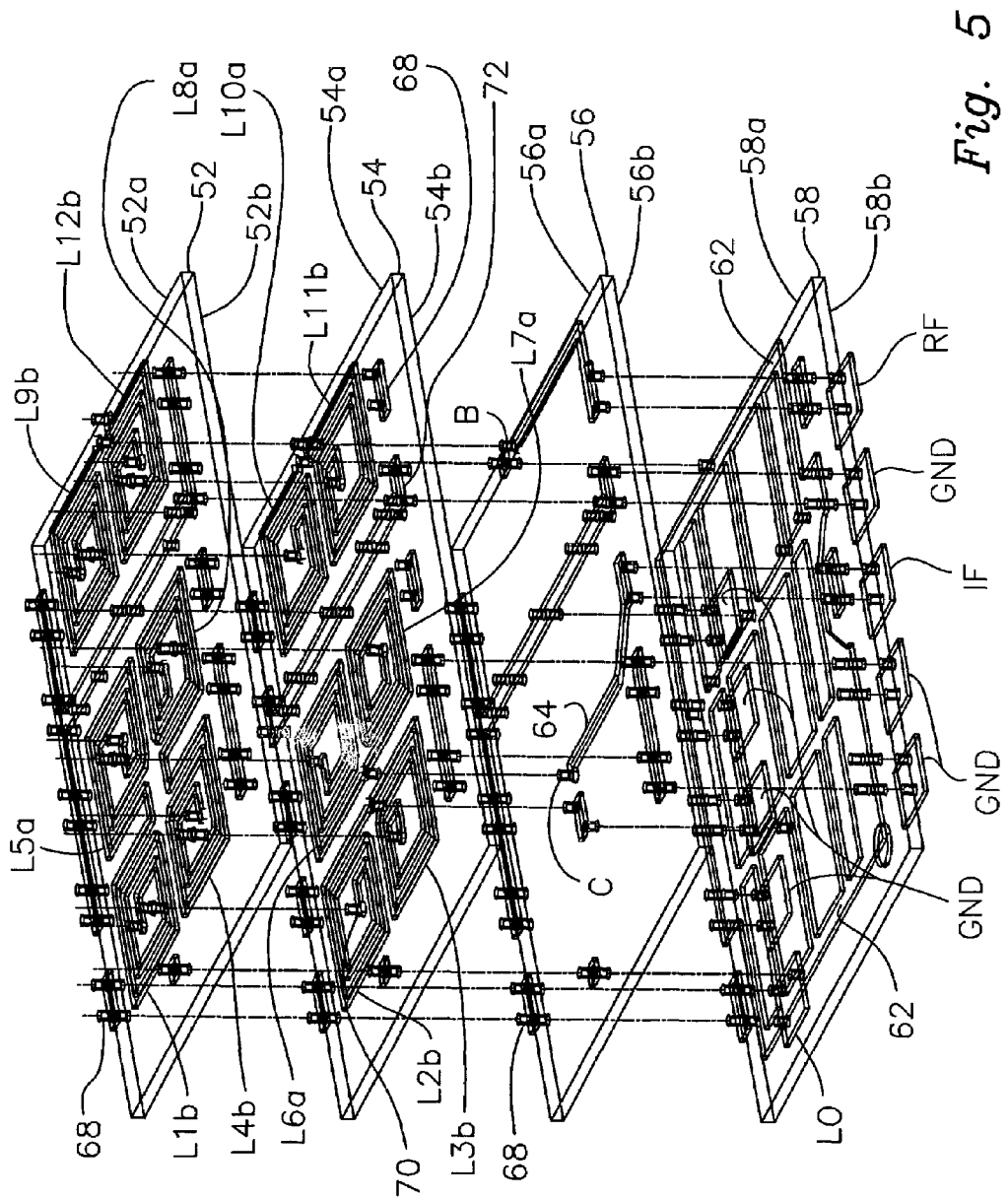
FIG. 5 is an enlarged view of the lower layers of FIG. 3.
Figure 6:
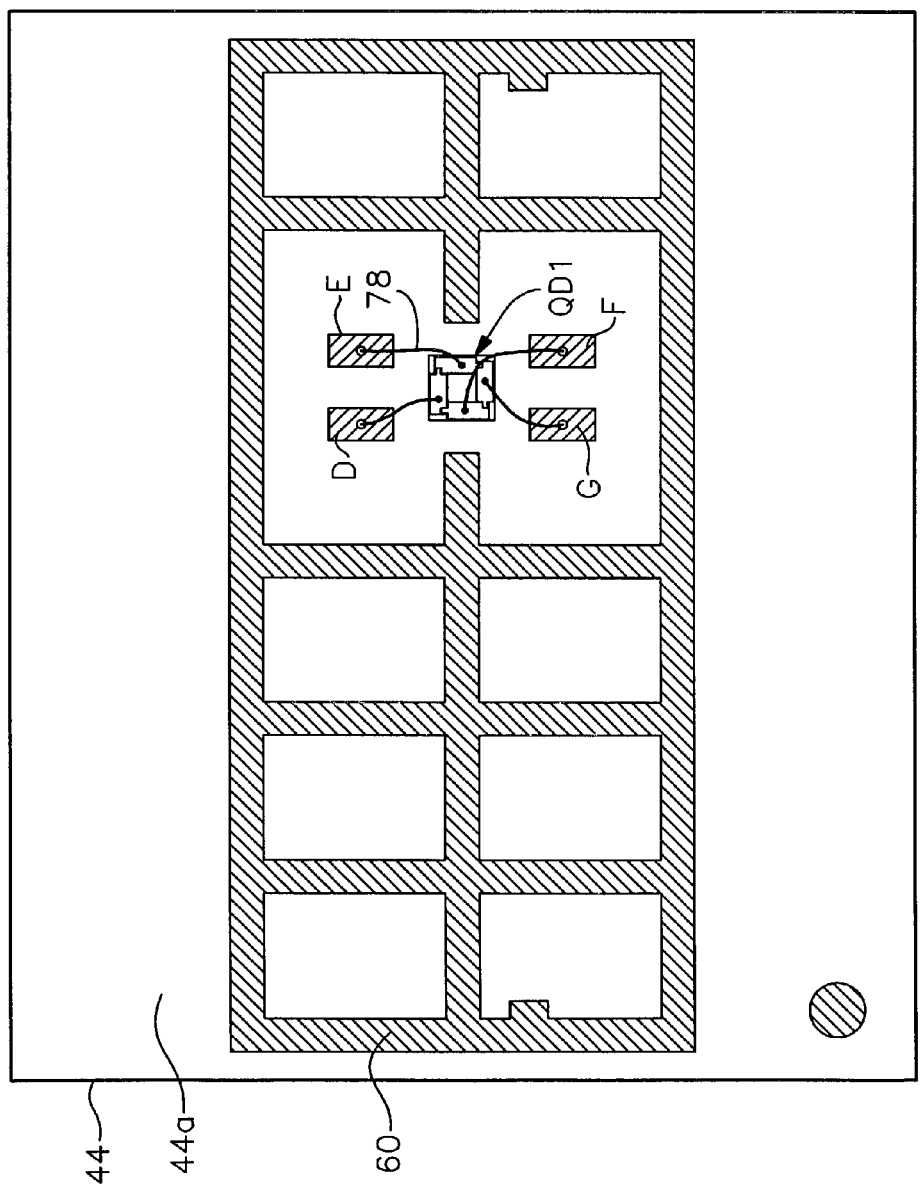
FIG. 6 is a top view of FIG. 3.

FIG. 2 shows a schematic diagram of the preferred embodiment of a double balanced mixer 40. Mixer 40 is similar to mixer 20 except that the baluns T1, T2 and T3 have split series connected windings. Mixer 40 has a local oscillator input terminal LO for receiving a local oscillator signal, an RF input terminal RF for receiving an RF signal and an intermediate frequency output terminal IF for providing an intermediate frequency output signal.

Local oscillator terminal LO is connected to local oscillator balun transformer T1. Transformer T1 has windings L1a, L1b, L2a, L2b, L3a, L3b, L4a and L4b. Windings L1a and L2a are electro-magnetically coupled as are windings L3a and L4a, L1b and L2b, and L3b and L4b. Windings L1a and L1b are serially connected. Winding L1b is connected to node H. Winding L1a is connected to terminal LO. Windings L2a and L2b are serially connected. Winding L2a and L2b are connected to ground. Windings L3a and L3b are serially connected. Winding L3a is connected to terminal LO. Winding L3b is connected to ground. Windings L4a and L4b are serially connected Winding L4a is connected to ground and winding L4b is connected to node J.

Intermediate frequency output terminal IF is connected to intermediate frequency balun transformer T2. Balun T2 has windings L5a, L5b, L6a, L6b, L7a, L7b, L8a and L8b. Windings L5a and L6a are electro-magnetically coupled as are windings L7a and L8a, L5b and L6b, and L7b and L8b. Windings L5a and L5b are serially connected as are windings L6a and L6b, windings L7a and L7b and windings L8a and L8b. Winding L5a is connected to node H. Winding L5b is connected to ground. Winding L6a is connected to terminal IF. Winding L6b is connected to node D of diode ring QD1. Winding L7a is connected to terminal IF. Winding L7b is connected to node G. Winding L8a is connected to node J. Winding L8b is connected to ground. The intermediate frequency signal IF is connected to terminal IF through balun T2.

Diode ring QD1 has four diodes D1, D2, D3 and D4. The diodes have their cathodes connected to the anodes of the adjoining diodes. Diode QD1 has nodes D, E, F and G.

RF input terminal RF is connected to RF balun transformer T3. Balun T3 has windings L9a, L9b, L10a, L10b, L11a, L11b, L12a and L12b. Windings L9a and L10a are electro-magnetically coupled as are windings L11a and L12a, windings L9b and L10b, L11b and L12b. Winding L9b is connected to terminal RF. Winding L9a is connected to node E. Windings L10a and L10b are connected to ground. Winding L11b is connected terminal RF. Winding L11a is connected to ground. Winding L12a is connected to node F. Winding L12b is connected to ground. Thus, the RF signal is connected to mixer 20 through balun transformer T3.

Referring now to FIGS. 3–6, the double balanced mixer 40 shown in the schematic of FIG. 2 is realized in a physical package. Mixer 40 has a low temperature co-fired ceramic (LTCC) structure or substrate 42. LTTC substrate 42 is comprised of multiple layers of LTCC material. There are eight LTCC layers in total. Planar layers 44, 46, 48, 50, 52, 54, 56 and 58 are all stacked on top of each other and form a unitary structure 42 after firing in an oven. Layer 44 is the top layer. Layer 58 is the bottom layer and layers 46, 48, 50, 52, 54 and 56 form inner layers 43. LTCC layers 44–58 are commercially available in the form of a green unfired tape. Each of the layers has a top surface 44A, 46A, 48A, 50A, 52A, 54A, 56A and 58A. Similarly, each of the layers has a bottom surface 44B, 46B, 48B, 50B, 52B, 54B, 56B and 58B. The layers have several circuit features that are patterned on the surfaces. Multiple vias 68 extend through each of the layers. Vias 68 are formed from an electrically conductive material and electrically connect the circuit features on one layer to the circuit features on another layer.

Layer 44 has several circuit features that are patterned on surface 44A. Surface 44A has ground plane 60 and wire bond pads D, E, F and G. Layers 46 and 56 have several circuit lines 64 that are patterned on surface 46A and 56A. Vias 68 connect circuit lines 64 and the pads on layer 44.

Layer 48 has six spiral shaped lines formed into windings L1a, L4a, L6b, L7b, L9a and L12a patterned on surface 48A. Similarly, layer 50 has six windings L2a, L3a, L5b, L8b, L10b and L11a patterned on surface 50A. Layer 52 has six windings L1b, L4b, L5a, L8a, L9b and L12b patterned on surface 52A. Layer 54 has six windings L2b, L3b, L6a, L7a, L10a and L11b patterned on surface 54A. The windings are shaped as spiral lines on surfaces 48A, 50A, 52A and 54A.

Windings L1a, L1b, L2a, L2b, L3a, L3b, L4a and L4b form balun T1. Windings L5a, L5b, L6a, L6b, L7a, L7b, L8a and L8b form balun T2. Windings L9a, L9b, L10a, L10b, L11a, L11b, L12a and L12b form balun T3. The a and b windings are located on separate layers that have one or more layers in between. The 1-2, 3-4, 5-6, 7-8, 9-10 and 11-12 winding pairs are located on adjacent layers and are electro-magnetically coupled through the dielectric of layers 48, 50 and 52. The windings are connected to their respective vias. A via 70 is located at the center of each spiral winding.

Layers 46, 48, 50, 52, 54 and 56 have a ground connection 72 that is patterned on their upper surfaces. Layer 58 has a ground plane 62 patterned on surface 58A. Ground pads GND, RF port pad RF, LO port pad LO and IF port pad IF are patterned on surface 58B and are connected to vias 68. Vias 68 connect the ground plane 62 to ground pads GND. The ground plane 62 helps to prevent warping of the LTCC structure during fabrication and also acts as an impedance reference plane and reduces cross-talk noise and externally coupled EMI noise.

The circuit features are formed by screening a thick film paste material and firing in an oven. This is a conventional process that is well known in the art. First, the LTCC layers have via holes punched, the vias are then filled with a conductive material. Next, the circuit features are screened onto the layers. The pads, ground connections, ground plane and circuit lines are formed with a conductive material. The layers are then aligned and stacked on top of each other to form LTCC substrate 42. The LTCC substrate 42 is then fired in an oven at approximately 900 degrees centigrade to form a unitary piece.

After firing, a diode quad semiconductor die QD1 is attached to top surface 44A by an epoxy (not shown). The die (semiconductor chip) is used in bare form to reduce size and cost. Wire bonds 78 are placed between connection points on the die and wire bond pads D, E, F and G. Additional epoxy would be placed over the die QD1 after wire bonding for protection.

Electrical leads (not shown) may optionally be soldered to the pads on surface 58B. Mixer 40 would be mounted to a printed circuit board by soldering either the pads on surface 58B or electrical leads attached to surface 58B to a printed circuit board (not shown).

A substrate 42 according to the present invention was fabricated having dimensions of 0.25 inches in length by 0.3 inches wide by 0.065 inches in height. This low height is ideal for PCMCIA applications.

The present invention has several advantages. Since, the baluns T1, T2 and T3 are integrated into substrate 42 on inner layers 43, they take up less space, resulting in a smaller package that is easier to assemble and to automate production of. This provides a savings of space on the printed circuit board and allows for a faster assembly process at lower cost. In addition, repeatability of electrical performance is of prime concern. Fabricating the mixer using an LTCC process results in a more uniform electrical performance in the resulting mixer. Specifically, the balun windings are more repeatable to fabricate. The LTCC layers have tightly controlled tolerances including thickness that provides well defined RF characteristics to frequencies above 10 GHz. Another advantage of the present invention is that using thick film conductors of noble metals, such as silver, reduces circuit losses. The multi-layer structure of the LTCC substrate allows a vertical build up of circuit layers that result in a package that takes up less space on a printed circuit board.

The ground connection 72 runs between several of the spiral windings. In addition, some of the interconnecting vias 68 are connected to ground. These isolate baluns T2 and T3 and provide good L-R isolation on the order of 35 to 40 dB. This level of isolation is difficult to achieve using ferrite transformers. The ground planes 60 and 62 provide shielding and minimize external radiation from entering. Ground plane 62 minimizes the effect that an underlying printed circuit board has on the impedance of the balun windings.

Two mixers were fabricated according to the present invention and were tested for electrical performance. One mixer was optimized for an LO and RF frequency of 300 Mhz to 2400 MHz. The other mixer was optimized for an LO and RF frequency of 1000 Mhz to 4200 MHz. These mixers were measured for electrical performance and the results are shown in FIG. 11. It is noted that mixers can be fabricated using the present invention for higher and lower frequencies than were shown in the present examples.

Figure 7:
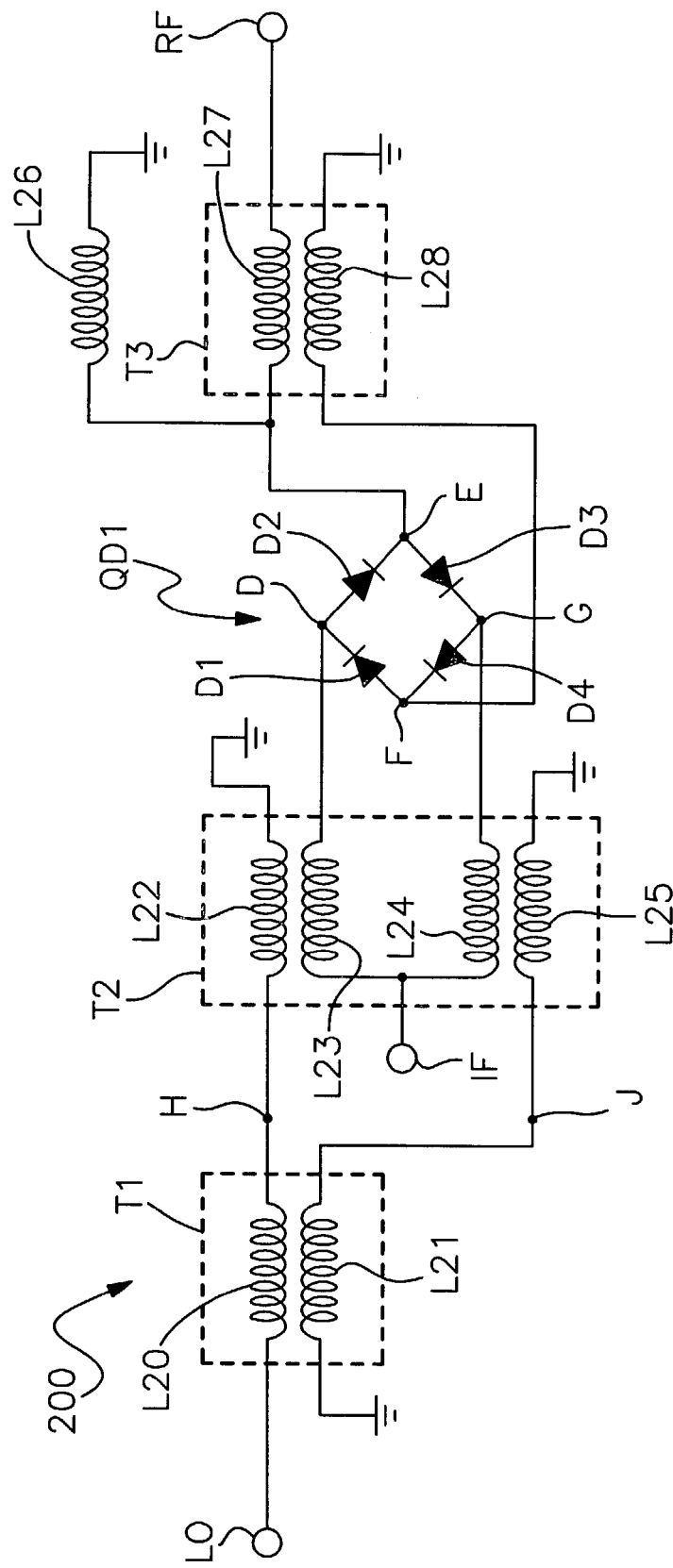
FIG. 7 is a schematic drawing of an alternative embodiment of a double balanced mixer.

Turning now to FIG. 7, an alternative embodiment of a double balanced mixer circuit 200 is shown. Mixer 200 has a local oscillator terminal LO that is connected to local oscillator balun transformer T1. Transformer T1 has windings L20 and L21. Windings L20 and L21 are electro-magnetically coupled. Winding L20 has one end connected to node H and the other end connected to terminal LO. Winding L21 has one end connected to ground and the other end connected to node J.

Intermediate frequency output terminal IF is connected to intermediate frequency balun transformer T2. Balun T2 has windings L22, L23, L24 and L25. Windings L22 and L23 are electro-magnetically coupled as are windings L25 and L26. Winding L22 has one end connected to node H and the other end connected to ground. Winding L23 has one end connected to terminal IF and another end connected to node D of diode ring QD1. Winding L24 has one end connected to terminal IF and the other end connected to node G. Winding L25 has one end connected to node J and the other end connected to ground. Windings L23 and L24 are connected together at terminal IF. Diode ring QD1 has four diodes D1, D2, D3 and D4. The diodes have their cathodes connected to the anodes of the adjoining diodes. Diode QD1 has nodes D, E, F and G.

The RF input terminal RF is connected to RF balun transformer T3. Balun T3 has windings L27 and L28. Windings L27 and L28 are electro-magnetically coupled. Winding L27 has one end connected to terminal RF and the other end connected to node E. Winding L28 has one end connected to ground and the other end connected to node F. A winding L26 is connected between node E and ground. The mixer 200 of FIG. 7 differs from mixer 40 in configurations of baluns. Mixer 200 has the advantage of even smaller size and higher frequency. Mixer 200 can also be implemented on a low temperature co-fired ceramic substrate.

Figure 8:
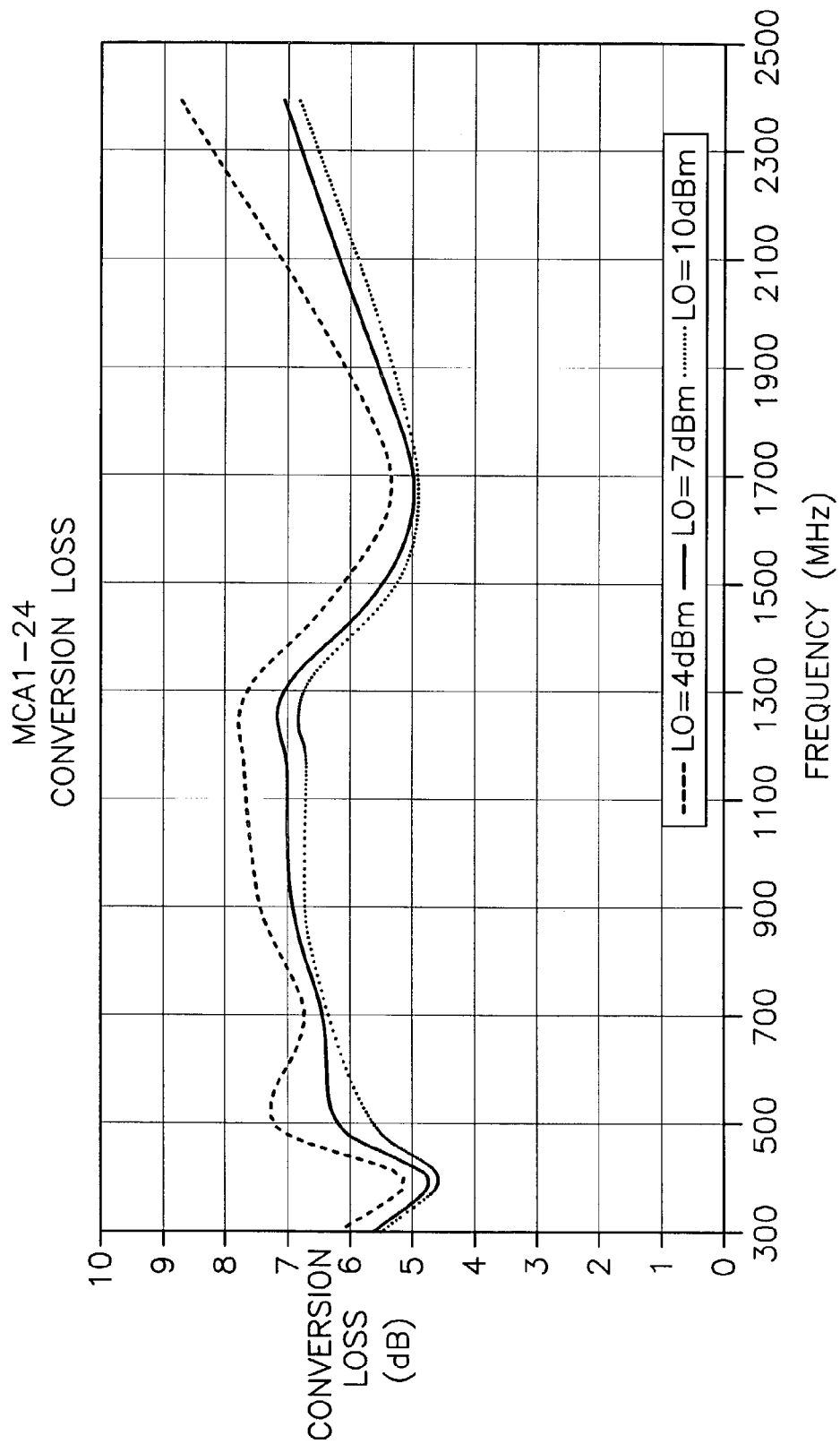
FIG. 8 is a graph of conversion loss versus frequency for the mixer of FIG. 3.

FIG. 8 shows a graph of conversion loss versus frequency for mixer 40. Line 102 is for an LO of 4 dBm, line 104 is for an LO of 7 dBm and line 106 is for an LO of 10 dBm. The conversion loss averaged 6.1 dB over the frequency range.

Figure 9:
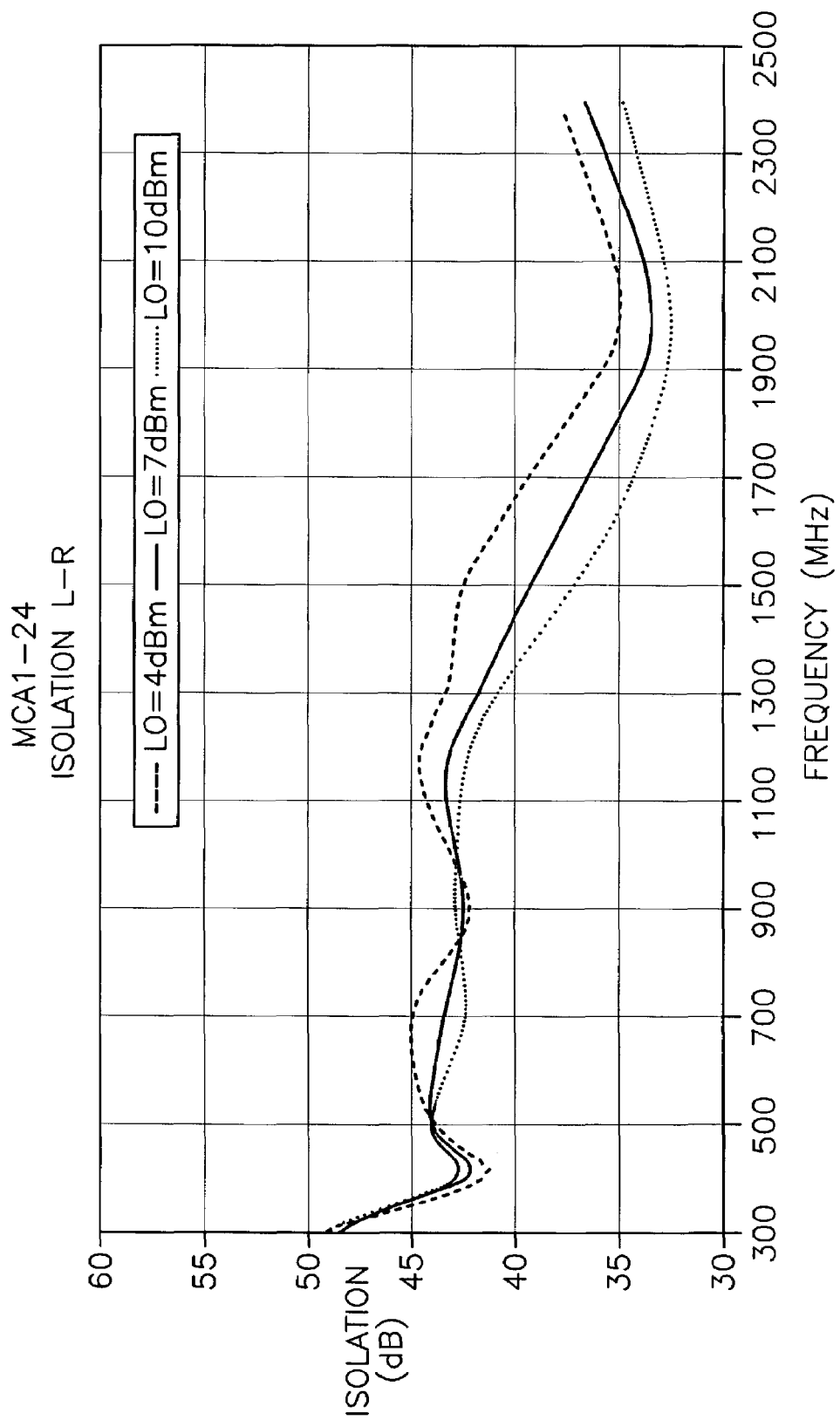
FIG. 9 is a graph of L-R isolation versus frequency for the mixer of FIG. 3.

FIG. 9 shows a graph of LO port to RF port (L-R) isolation versus frequency for mixer 40. Line 112 is for an LO of 4 dBm, line 114 is for an LO of 7 dBm and line 116 is for an LO of 10 dBm. The L-R isolation is very good between 500 and 1500 MHz.

Figure 10:
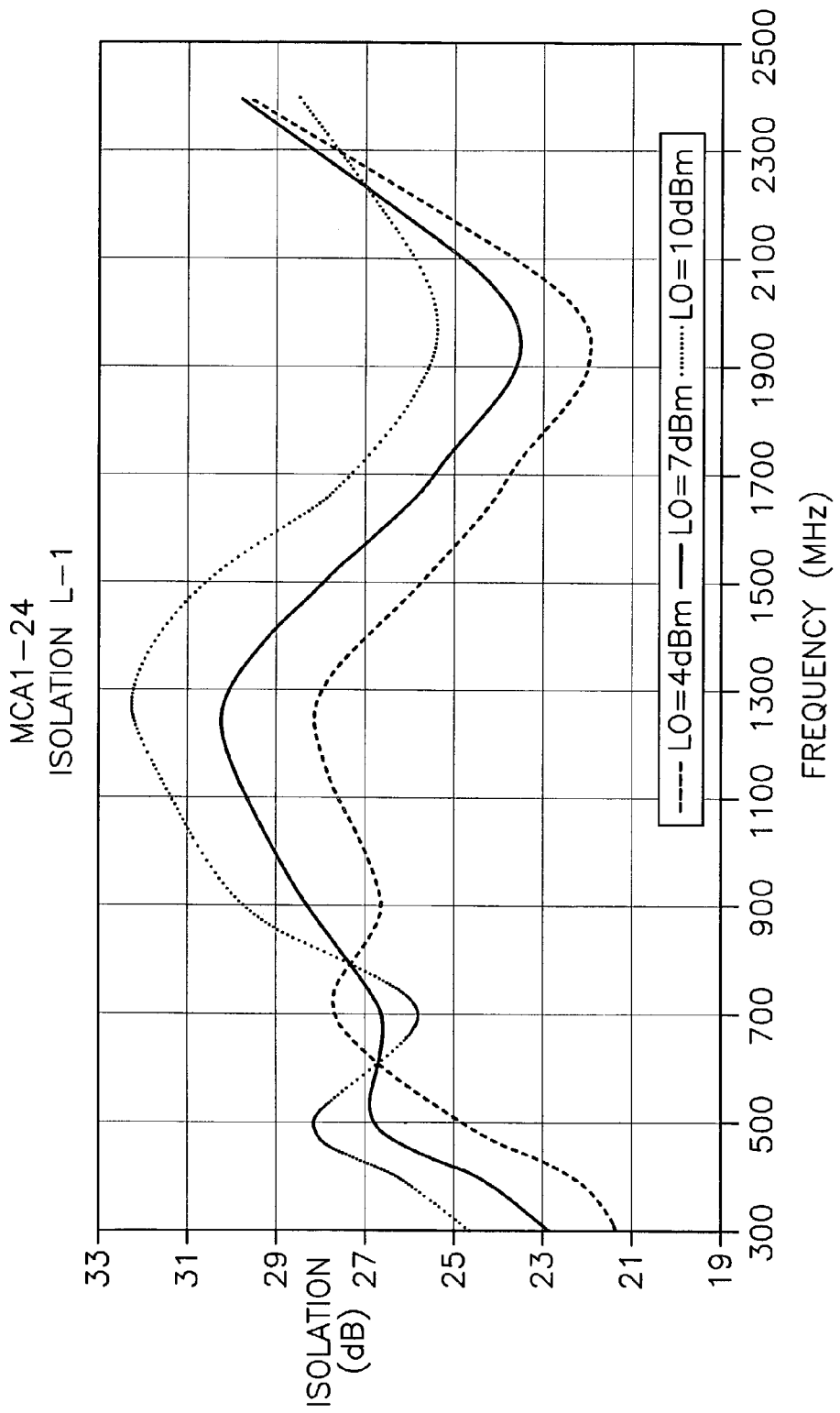
FIG. 10 is a graph of L-I isolation versus frequency for the mixer of FIG. 3.

FIG. 10 shows a graph of LO port to IF port (L-I) isolation versus frequency. Line 122 is for an LO of 4 dBm, line 124 is for an LO of 7 dBm and line 126 is for an LO of 10 dBm.

The mixer of the present invention is small in size, high in performance, has high L-R isolation, handles a wide range of frequencies, needs fewer manufacturing steps and is low in cost providing an improvement over previous mixers.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the description. All changes that come within the meaning and range of equivalency of the claims are to be embraced within their scope.

What is claimed is:

1. A mixer for mixing an RF input signal with a local oscillator signal to provide an intermediate frequency signal, comprising:

(a) a plurality of planar layers, the layers located adjacent each other and including a top layer, a bottom layer and inner layers;

(b) a plurality of vias interconnecting the layers;
(c) a plurality of circuit lines located on the inner layers and connected to the vias;
(d) a plurality of diodes mounted to the top layer and electrically connected to the vias;
(e) a first balun located on the inner layers and electrically connected to the vias, the first balun connected to the local oscillator signal; and
(f) a second balun located on the inner layers and electrically connected to the vias, the second balun connected to the intermediate frequency signal and the first balun connected to the second balun; and
(g) a third balun located on the inner layers and electrically connected to the vias, the third balun connected to the RF input signal and the diodes being connected between the second balun and the third balun.

2. The mixer according to claim 1, wherein the first balun further comprises:
   a) a first and second winding located on a first inner layer;
   b) a third and fourth winding located on a second inner layer;
   c) a fifth and sixth winding located on a third inner layer; and
   d) a seventh and eighth winding located on a fourth inner layer, the windings each having ends connected to one of the vias.

3. The mixer according to claim 2, wherein the first and third windings are electromagnetically coupled.

4. The mixer according to claim 2, wherein the second and fourth windings are electromagnetically coupled.

5. The mixer according to claim 2, wherein the fifth and seventh windings are electromagnetically coupled.

6. The mixer according to claim 2, wherein the sixth and eighth windings are electromagnetically coupled.

7. The mixer according to claim 2, wherein the first and fifth windings are series connected.

8. The mixer according to claim 2, wherein the second and sixth windings are series connected.

9. The mixer according to claim 2, wherein the third and seventh windings are series connected.

10. The mixer according to claim 2, wherein the fourth and eighth windings are series connected.

11. The mixer according to claim 1, wherein the second balun further comprises:
    a) a ninth and tenth winding located on a first inner layer;
    b) an eleventh and twelfth winding located on a second inner layer;
    c) a thirteenth and fourteenth winding located on a third inner layer; and
    d) a fifteenth and sixteenth winding located on a fourth inner layer, the windings each having ends connected to one of the vias.

12. The mixer according to claim 11, wherein the ninth and eleventh windings are electromagnetically coupled.

13. The mixer according to claim 12, wherein the ninth and eleventh windings are electromagnetically coupled.

14. The mixer according to claim 11, wherein the fourteenth and sixteenth windings are electromagnetically coupled.

15. The mixer according to claim 12, wherein the thirteenth and fifteenth windings are electromagnetically coupled.

16. The mixer according to claim 11, wherein the ninth and fifteenth windings are series connected.

17. The mixer according to claim 11, wherein the tenth and sixteenth windings are series connected.

18. The mixer according to claim 11, wherein the eleventh and thirteenth windings are series connected.

19. The mixer according to claim 11, wherein the twelfth and fourteenth windings are series connected.

20. The mixer according to claim 1, wherein the third balun further comprises:
    a) a seventeenth and eighteenth winding located on a first inner layer;
    b) an nineteenth and twentieth winding located on a second inner layer;
    c) a twenty-first and twenty-second winding located on a third inner layer; and
    d) a twenty-third and twenty-fourth winding located on a fourth inner layer, the windings each having ends connected to one of the vias.

21. The mixer according to claim 20, wherein the seventeenth and nineteenth windings are electromagnetically coupled.

22. The mixer according to claim 20, wherein the eighteenth and twentieth windings are electromagnetically coupled.

23. The mixer according to claim 20, wherein the twenty-first and twenty-third windings are electromagnetically coupled.

24. The mixer according to claim 20, wherein the twenty-second and twenty-fourth windings are electromagnetically coupled.

25. The mixer according to claim 20, wherein the seventeenth and twenty-first windings are series connected.

26. The mixer according to claim 20, wherein the eighteenth and twenty-second windings are series connected.

27. The mixer according to claim 20, wherein the nineteenth and twenty-third windings are series connected.

28. The mixer according to claim 20, wherein the twentieth and twenty-fourth windings are series connected.

29. A double balanced mixer comprising: (a) a substrate formed from a plurality of layers, the substrate including a top layer, a bottom layer and inner layers;
    (b) a plurality of vias extending through the substrate;
    (c) a local oscillator balun, an intermediate frequency balun and an RF balun located on four of the inner layers, the baluns connected to the vias such that the local oscillator balun is connected to the intermediate frequency balun; and
    (d) a plurality of diodes mounted on the top layer, the diodes connected to the vias such that the diodes are connected between the RF balun and the intermediate frequency balun, the diodes mixing a local oscillator signal with an RF signal to provide an intermediate frequency signal.

30. The mixer according to claim 29, wherein a plurality of circuit lines are located on the inner layers.

31. The mixer according to claim 29, wherein a plurality of bond pads are located on the top surface and are electrically connected to the vias.

32. The mixer according to claim 29, wherein the diodes are four diodes arranged in a ring.

33. The mixer according to claim 32, wherein the diodes are located in a semiconductor die.

34. The mixer according to claim 33, wherein the semiconductor die is bonded to the top layer with an epoxy and is electrically connected to the bond pads by a plurality of wire bonds.

35. The mixer according to claim 29, wherein the layers are low temperature co-fired ceramic.

36. The mixer according to claim 29, wherein a ground plane is located on the top layer.

37. The mixer according to claim 29, wherein a ground plane is located on the bottom layer.

38. A double balanced mixer comprising:
   a) a local oscillator balun having a local oscillator terminal for receiving a local oscillator signal;
   b) an intermediate frequency balun having an intermediate frequency terminal for providing an intermediate frequency signal, the intermediate frequency balun connected to the local oscillator balun;
   c) an RF balun having an RF terminal for receiving an RF signal;
   d) a diode ring connected between the RF balun and the intermediate frequency balun, the diodes mixing the local oscillator signal with the RF signal to provide the intermediate frequency signal;
   e) a substrate having a plurality of layers, the substrate including a top layer, a bottom layer and inner layers, the baluns mounted to the inner layers and the diode ring mounted to the top layer; and
   f) a plurality of vias extending through the substrate, the vias providing an electrical connection between the baluns and the diode ring.

39. The mixer according to claim 38, wherein each balun has eight windings.

40. The mixer according to claim 39, wherein the eight windings are arranged in four series connected pairs of windings.

41. The mixer according to claim 39, wherein the eight windings are located on four of the inner layers.

42. The mixer according to claim 38, wherein the layers are low temperature co-fired ceramic.

43. The mixer according to claim 38, wherein a ground plane is located on the top layer.

44. The mixer according to claim 38, wherein a ground plane is located on the bottom layer.

* * * * *